United States Patent
Czerkas et al.

(10) Patent No.: US 10,303,153 B2
(45) Date of Patent: May 28, 2019

(54) METHOD AND COMPUTER PROGRAM PRODUCT FOR CONTROLLING THE POSITIONING OF PATTERNS ON A SUBSTRATE IN A MANUFACTURING PROCESS

(71) Applicant: KLA-Tencor Corporation, Milpitas, CA (US)

(72) Inventors: Slawomir Czerkas, Weilburg (DE); Frank Laske, Weilmünster (DE)

(73) Assignee: KLA-Tencor Corporation, Milpitas, CA (US)

(*) Notice: Subject to any disclaimer, the term of this patent is extended or adjusted under 35 U.S.C. 154(b) by 311 days.

(21) Appl. No.: 15/129,521

(22) PCT Filed: Aug. 4, 2016

(86) PCT No.: PCT/US2016/045604
§ 371 (c)(1),
(2) Date: Sep. 27, 2016

(87) PCT Pub. No.: WO2018/026373
PCT Pub. Date: Feb. 8, 2018

(65) Prior Publication Data
US 2018/0120807 A1 May 3, 2018

(51) Int. Cl.
*G05B 19/40* (2006.01)
*G05B 19/402* (2006.01)
*G03F 9/00* (2006.01)

(52) U.S. Cl.
CPC ......... *G05B 19/402* (2013.01); *G03F 9/7003* (2013.01); *G05B 2219/45028* (2013.01); *G05B 2219/45031* (2013.01)

(58) Field of Classification Search
CPC ........ G05B 19/402; G05B 2219/45028; G03F 9/7003
See application file for complete search history.

(56) References Cited

U.S. PATENT DOCUMENTS 6,486,954 B1 * 11/2002 Mieher ................ G01B 11/002
356/399
6,886,153 B1 * 4/2005 Bevis .................. G03F 7/70533
716/51
(Continued)

FOREIGN PATENT DOCUMENTS

KR  20030073253    9/2003
WO  2015189001   12/2015
(Continued)

OTHER PUBLICATIONS

ISA/KR, International Search Report for PCT/US2016/045604 dated Apr. 28, 2017.
(Continued)

*Primary Examiner* — Laura M Menz
(74) *Attorney, Agent, or Firm* — Hodgson Russ LLP

(57) ABSTRACT

In a method for controlling the positioning of patterns on a substrate in a manufacturing process at least one registration measurement is conducted with a registration tool on at least one pattern formed in at least one layer on the substrate by a previous process step of the manufacturing process. From the registration measurement a position of the at least one pattern in a coordinate system is determined. The determined position of the at least one pattern is fed into an automatic process control of a manufacturing system for controlling a setup of the manufacturing system for a subsequent process step of the manufacturing process. The manufacturing process may be a wafer manufacturing process with a silicon substrate. Complementary information may be collected in addition to performing the registration measurement and fed to the automatic process control. The process steps may for example include lithography steps, etching steps, layer deposition.

23 Claims, 6 Drawing Sheets

(56) References Cited

U.S. PATENT DOCUMENTS

| | | | |
|---|---|---|---|
| 2008/0246936 A1 | 10/2008 | Loopstra et al. | |
| 2015/0112624 A1 | 4/2015 | Adel et al. | |
| 2015/0146188 A1 | 5/2015 | Lyulina et al. | |
| 2018/0087900 A1* | 3/2018 | Paskover | G01B 11/272 |
| 2018/0113084 A1* | 4/2018 | Hench | G01N 23/20083 |
| 2018/0120807 A1* | 5/2018 | Czerkas | G05B 19/402 |
| 2018/0165404 A1* | 6/2018 | Eyring | H01L 22/12 |
| 2018/0330511 A1* | 11/2018 | Ha | G06T 7/30 |

FOREIGN PATENT DOCUMENTS

| | | | | |
|---|---|---|---|---|
| WO | WO 2015189001 A1 * | 12/2015 | | G03F 9/7049 |
| WO | WO-2018026373 A1 * | 2/2018 | | G05B 19/402 |

OTHER PUBLICATIONS

ISA/KR, Written Opinion of the International Searching Authority for PCT/US2016/045604 dated Apr. 28, 2017.

\* cited by examiner

METHOD AND COMPUTER PROGRAM PRODUCT FOR CONTROLLING THE POSITIONING OF PATTERNS ON A SUBSTRATE IN A MANUFACTURING PROCESS

FIELD OF THE INVENTION

The present invention relates to a method for controlling the positioning of patterns on a substrate in a manufacturing process.

Additionally, the invention relates to a computer program product for controlling the positioning of patterns on a substrate in a manufacturing process.

BACKGROUND OF THE INVENTION

For structures or devices manufactured in a layer-by-layer approach, like for example semiconductor devices on a wafer, correct positioning of patterns relative to each other, in one and the same layer or in different layers, is of crucial importance for the function of the device. For example, correct relative positioning of such patterns is important to achieve a desired electrical contact between such patterns, or to avoid an undesired electrical contact between such patterns. Inadequate control of the positioning of patterns therefore can lead to high losses during production of the devices, i.e. to low production yield.

Prior art achieves control of the positioning of patterns by what is known as overlay (OVL) measurements. OVL metrology based on optical images and/or on optical scatterometry is currently typically used for controlling the correct positioning of semiconductor devices on substrates. These optical measurements may be augmented by other methods, like Scanning Electron Microscopy (SEM) or Transmission Electron Microscopy (TEM), used to validate or even calibrate/offset the results of the optical measurements. OVL measurements reveal the relative position of patterns placed on a substrate. Optical OVL measurements are currently possible only for specially designed metrology targets, i.e. patterns specifically provided on the substrate, or layers thereon, for the purpose of such measurements; optical OVL measurements on functional patterns, i.e. on patterns which are provided to perform some function in the semiconductor device manufactured, in most cases are not possible. From the principle of OVL measurements, measuring the relative position of patterns placed on the substrate, it is clear that OVL information can only be used as a feedback for the manufacturing process, i.e. the OVL information is only obtained after the layers on which the OVL measurement is performed have been placed on the substrate and patterned. This information can then be used in the creation of further patterns, and in particular if patterns corresponding to the patterns measured are created on a subsequent substrate, i.e. on a substrate on which the creation of these patterns is performed after the OVL measurement which provided the information.

Thus, based on OVL information, i.e. information obtained from OVL measurements, it is not possible to predict the position of patterns yet to be placed on the substrate, so no feed forward of OVL information is possible. The reason is, as should be clear from the above, that OVL measurements only reveal the relative position of patterns. If, for example, two layers, a first layer and a second layer, have already been placed on the substrate, and a third layer is to be placed on the substrate, then, in order to achieve correct positioning of the patterns in the third layer with respect to the second layer, the pattern placement in the second layer has to be known before forming the patterns in the third layer. OVL measurements, however, in this case provide only the relative positions between patterns of the first layer and of the second layer. Separate information on the placement of the patterns in the second layer cannot be extracted from these relative positions. The fact that only specially designed metrology targets can be measured, while it is the functional patterns where the correct placement is crucial, is a further disadvantage of prior art. As these metrology targets are typically larger than 10 µm by 10 µm, it is not possible to place a large number of such metrology targets in the vicinity of functional patterns.

SUMMARY OF THE INVENTION

It therefore is an object of the invention to improve the yield of a manufacturing process, shorten the time needed to achieve high yield, shorten reaction times to process excursions, and simplify the control loop for the manufacturing process.

This object is achieved by a method according to claim 1.

The method according to the invention is a method for controlling the positioning of patterns on a substrate in a manufacturing process. The manufacturing process builds a device in a layer-by-layer approach on the substrate, by creating patterns in layers applied on the substrate. According to the inventive method, at least one registration measurement is conducted on at least one pattern formed in at least one layer on the substrate by a previous process step of the manufacturing process. The previous process step may be any step of the manufacturing process, conducted prior to the registration measurement, which created or modified a pattern in a layer on the substrate. The registration measurement is carried out with a registration tool. The registration measurement may be an optical registration measurement, done for example with a registration tool of the IPRO series available from KLA Tencor. Alternatively, the registration measurement may also be based on a particle beam, employing methods like Scanning Electron Microscopy (SEM) or Helium Ion Microscopy (HIM); Scanning Force Microscopy (SFM) or Atomic Force Microscopy (AFM) is a further technique that can be used for performing the registration measurement. From the registration measurement, a position of the at least one pattern in a coordinate system is determined. This coordinate system may be any coordinate system suitable for the manufacturing process. The registration measurement yields coordinates relative to a coordinate system of the registration tool, and these coordinates can then be converted into a coordinate system for the manufacturing process. The coordinate system for the manufacturing process may be identical to the coordinate system of the registration tool. The coordinate system for the manufacturing process serves as a common reference coordinate system for all the patterns to be created in various layers on the substrate during the manufacturing process. This common reference overcomes the problem of prior art overlay measurements that only information on the relative positioning between patterns was available. The position of the at least one pattern in the coordinate system for the manufacturing process is then fed into an automatic process control of a manufacturing system for controlling a setup of the manufacturing system for a subsequent process step of the manufacturing process. The subsequent process step may be any process step of the manufacturing process conducted at any stage of the manufacturing process after the previous process step. One or plural further steps of the manufacturing process may be conducted, but need not be conducted, between the previous process step and the subsequent process step. As the position of the at least one pattern relative to the common reference given by the coordinate system of the manufacturing process is known, the manufacturing system can be suitably controlled to achieve correct placement of patterns to be created after the registration measurement, in the same layer as the pattern on which the registration measurement was performed or in a different layer on the substrate. This means that the measured position can be used in a feed-forward control loop. So, contrary to the case of prior art overlay measurements, the manufacturing system can react to the placement of individual patterns, not only to detected deviations from desired relative positions of patterns already created in layers on the substrate. In this way, many otherwise possible placement errors can be avoided, implying a reduction of loss and an increase of yield of the manufacturing process. As the manufacturing system can react to the placement of individual patterns, the reaction time to process excursions is reduced and possible drops in yield can be countered more quickly. Furthermore, control of the manufacturing process is simpler, as the position of individual patterns, not just relative positions between patterns, is available, which makes identification of errors and possible countermeasures simpler.

In an embodiment the determined position of the at least one pattern is also fed to the automatic process control for controlling a setup of the manufacturing system for performing the previous process step of the manufacturing process on a subsequent substrate. This applies, for example, to cases in which a plurality of substrates are subject to the manufacturing process one after the other.

In an advantageous embodiment, in addition to the registration measurement complementary information is collected and fed into the automatic process control of the manufacturing system. The complementary information for example includes topography information on the substrate or overlay information between layers. Overlay information between layers is important to obtain the correct position of patterns in different layers in the coordinate system of the manufacturing process, as registration measurements on patterns in a layer only produce positions relative to that layer. Results from different layers have to be matched; this can be achieved by measuring the positions of a few patterns, in particular of specific overlay targets.

Complementary information may be collected at any stage during the manufacturing process at which it is deemed necessary. In particular, complementary information may be collected at least after the previous process step or at least after the subsequent process step. As the process steps may create or modify patterns in layers on the substrate, or affect the substrate on a larger scale, for example cause distortion of the substrate, changes to complementary information, like for example substrate topography, may occur. In such a case an update of complementary information is advantageous. Collected complementary information fed into the automatic process control contributes to correct placement of patterns and thus to avoiding errors, which in turn increases yield.

In embodiments the substrate is a silicon wafer. At least the previous process step or at least the subsequent process step may include performing lithography on the substrate. In particular, the manufacturing system may include a lithography scanner.

At least the previous process step or at least the subsequent process step may include performing an etching on the substrate. As a further example, at least the previous process step or at least the subsequent process step may include depositing a layer on the substrate. In such a layer, further patterns may be created by later steps of the manufacturing process. Further non-limiting examples of process steps that can constitute the previous process step or the subsequent process step are Chemical Mechanical Polishing (CMP), annealing, or resist developing. Another non-limiting example is to deposit additional material on the substrate, without this amounting to depositing an entire layer on the substrate.

In general, the at least one pattern may include a target for overlay measurements, i.e. a target as used in prior art overlay measurements. Such targets can also be used in the method according to the invention, registration measurements can be performed on them. However, with the method according to the invention registration measurements can also be performed on other types of pattern, in particular functional patterns. This is an important advantage of the method according to the invention, because the functional patterns are the patterns the correct placement of which is of particular importance, as their placement directly affects the functionality of the device manufactured. The method according to the invention allows direct measuring of the placement of such functional patterns, while prior art optical OVL measurements require OVL targets placed in the vicinity of the functional patterns, and can infer the placement of the functional features only indirectly, and, as has been said above, in the OVL measurement the placements are only placements relative to a further pattern. The prior art methods allowing OVL measurements on functional patterns, e.g. SEM, TEM, have several disadvantages, e.g. high cost, low throughput, destructive (TEM, partly SEM on resist), limited to only selected patterns and/or layers (SEM).

The method according to the invention is applicable to any manufacturing process building a device by forming patterns in layers on a substrate. An important example of such a manufacturing process, which, however, is not to be regarded a limitation of the invention, is semiconductor device manufacturing. In semiconductor device manufacturing usually silicon substrates are used.

A general embodiment of the method according to the invention, specifically directed to semiconductor device manufacturing, is a method for controlling the positioning of patterns on a silicon substrate in a manufacturing process for a wafer. According to the method at least one registration measurement is conducted on at least one pattern with a registration tool; possible ways of conducting a registration measurement have already been discussed above. The pattern has been formed in at least one layer on the substrate by lithography in a previous lithography process step of the manufacturing process; lithography at least comprises exposure of a resist applied on a layer in which a pattern is to be formed to light of a specific wavelength range. Following the general outline of the method, a position of the at least one pattern in a coordinate system for the manufacturing process is determined, as described above, from the registration measurement. The determined position of the at least one pattern is then fed into an automatic process control of a manufacturing system for controlling a setup of the manufacturing system for a subsequent lithography process step of the manufacturing process.

The determined position of the at least one pattern may also be fed to the automatic process control for controlling a setup of the manufacturing system for performing the previous lithography process step of the manufacturing process on a subsequent substrate.

In a more specific embodiment, at least one further process step is carried out between the previous lithography process step and the subsequent lithography process step. In this embodiment a registration measurement is carried out after at least one such further process step. Further registration measurements may be carried out after other further process steps. Also, complementary information may be collected after at least one of the at least one further process step and before the subsequent lithography step, and fed into the automatic process control. This is advantageous if the respective further process step creates a pattern or modifies a pattern in a layer on the substrate. For example, such a further process step may include an etching step, where part of a layer on the substrate is removed by etching to form a pattern. Further non-limiting examples are the deposition of a layer on the substrate, the application of resist on the substrate, the removal of resist from the substrate, annealing, resist developing, or Chemical Mechanical Polishing (CMP).

In another specific embodiment, at least one further process step is carried out between the previous lithography process step and the subsequent lithography process step. At least one registration measurement is carried out before the at least one further process step, and, following the general outline of the method, a position of at least one pattern in a coordinate system of the manufacturing process is determined from the registration measurement. The position is fed into the automatic process control of the manufacturing system for controlling the setup of the manufacturing system for carrying out the at least one further process step. Complementary information may for example be collected after the further process step and fed into the automatic process control. For instance, the further process step may be an etching step. The position of at least one pattern, determined from the registration measurement, may be fed into the automatic process control to be taken into account when the manufacturing system performs the etching. After the etching, complementary information is collected to acquire data on possible changes of, for example, the topography of the substrate as a result of the etching. This complementary information is fed into the automatic process control to be taken into account in the further course of the manufacturing process. Of course, in addition to a registration measurement before the further process step, a further registration measurement may be carried out after the further process step. Providing also the results of this further registration measurement to the automatic process control allows an even tighter control of the further process step, like the etching in the example just mentioned.

In different embodiments the order of registration measurements, lithography steps, further process steps and collection of complementary information may be different. Generally speaking, registration measurements may be carried out at any stage of, meaning before or after any particular process step of, the manufacturing process, at which stage such measurements can be carried out by suitable registration tools. Over the course of the manufacturing process, all the registration measurements may be carried out with one and the same registration tool or with different registration tools, which in addition may implement different techniques of registration measurement. Likewise, complementary information may be collected at any stage of, meaning before or after any particular process step of, the manufacturing process, at which stage complementary information can be collected by suitable means. Different types of complementary information may be collected by different means. Complementary information may be collected at the same time as a registration measurement is performed or at a different time. For some types of complementary information, the means for collecting the complementary information may be implemented in a registration tool.

A specific embodiment of the method is a method for controlling the positioning of patterns on a silicon substrate in a manufacturing process for a wafer. In this specific embodiment, at least one pattern in at least one layer on the substrate is formed by lithography in a previous lithography process step of the manufacturing process. Then, an etch process is performed on the at least one layer on the substrate. After the etching, at least one registration measurement is conducted with a registration tool on at least one pattern formed in the at least one layer on the substrate and a position of the at least one pattern in a coordinate system of the manufacturing process is determined. Next, a first portion of complementary information is collected. Then at least one further process step, which may for example be the deposition of a further layer on the substrate, is conducted. After the at least one further process step, a second portion of complementary information is collected. The determined position of the at least one pattern, the collected first portion of complementary information, and the collected second portion of complementary information are fed into the automatic process control of the manufacturing system for controlling a setup of the manufacturing system for a subsequent lithography process step of the manufacturing process. Such a subsequent lithography process step may then be carried out by the manufacturing system. The determined position of the at least one pattern, the collected first portion of complementary information, and the collected second portion of complementary information may be fed into the automatic process control for example after the further process step. However, any such information may for example also be fed to the automatic process control once it has become available.

The manufacturing system may be controlled by at least one computer. In particular, the automatic process control can be implemented via at least one computer. The automatic process control for the manufacturing process comprises automatic process control for individual steps of the manufacturing process. On a non-transitory computer readable medium a computer program product may be provided to the at least one computer, the computer program product comprising computer readable instructions for the at least one computer to control the manufacturing system to carry out the method according to the invention.

BRIEF DESCRIPTION OF THE DRAWINGS

In the following, the invention will be described in greater detail with reference to the accompanying figures.

DETAILED DESCRIPTION OF THE INVENTION

Figure 1:
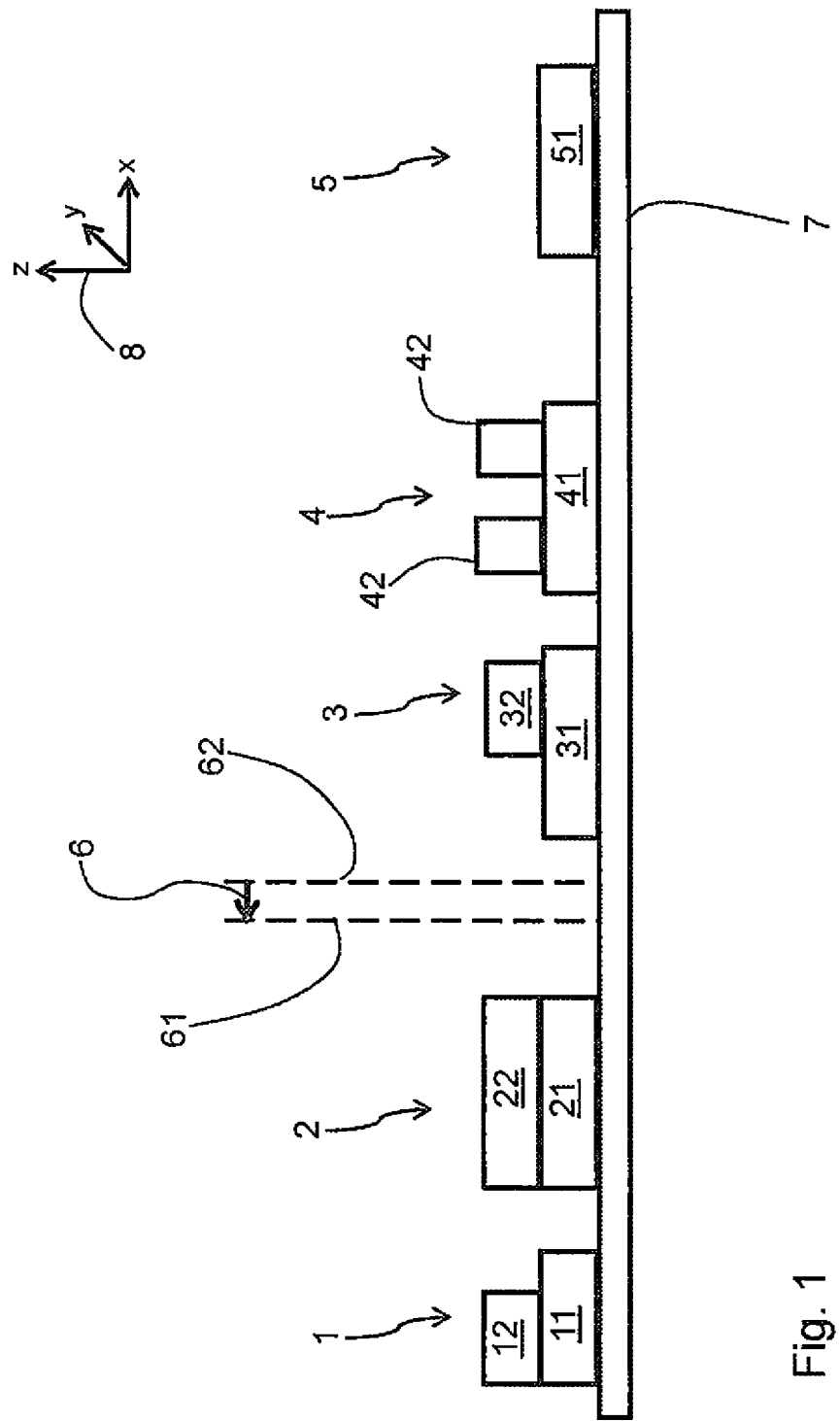
FIG. 1 schematically shows a side view of a substrate with patterns created thereon in a layer-by-layer manner.

In the figures like reference numerals are used for like elements or elements of like function. Furthermore, for the sake of clarity, only those reference numerals are shown in the figures which are necessary for discussing the respective figure.

FIG. 1 shows a substrate 7, which in semiconductor manufacturing may be a silicon wafer. On the substrate 7, several structures 1, 2, 3, 4, 5 have been created by lithography methods, more precisely photolithography, which, as such, is a known method in semiconductor manufacturing. The structures 1, 2, 3, 4, 5 have been created in a layer-by-layer approach, as is typical of lithography. For example, patterns 11, 21, 31, 41, 51 have been created in a first layer applied on the substrate 7, patterns 12, 22, 32, 42 have been created in a second layer applied on the substrate 7.

Also shown is a relative position shift 6 between patterns pertaining to different layers. Prior art overlay measurements can determine such a relative position shift 6 between patterns of different layers. The measurement of positions of edges of structures 21 and 31 yields a first average position 61, pertaining to the first layer, the measurement of positions of edges of structures 22 and 32 yields a second average position 62, pertaining to the second layer. The difference between the first average position 61 and second average position 62 is the relative position shift 6. Prior art overlay measurements cannot determine the position of a pattern, for example pattern 32, relative to a coordinate system 8 for the manufacturing process which is building the structures 1, 2, 3, 4, 5 on the substrate 7. If a further pattern in a third layer is to be applied on top of pattern 32, for example, the correct positioning of the further pattern relative to pattern 32 can only make use of information on the relative position shift 6 in prior art. Any error in the positioning can only be determined after the further pattern has been applied, and can only be determined relative to pattern 32. With the method according to the invention, the position of pattern 32 relative to coordinate system 8 is available, and therefore correct positioning of further patterns can be done with increased reliability.

Figure 2:
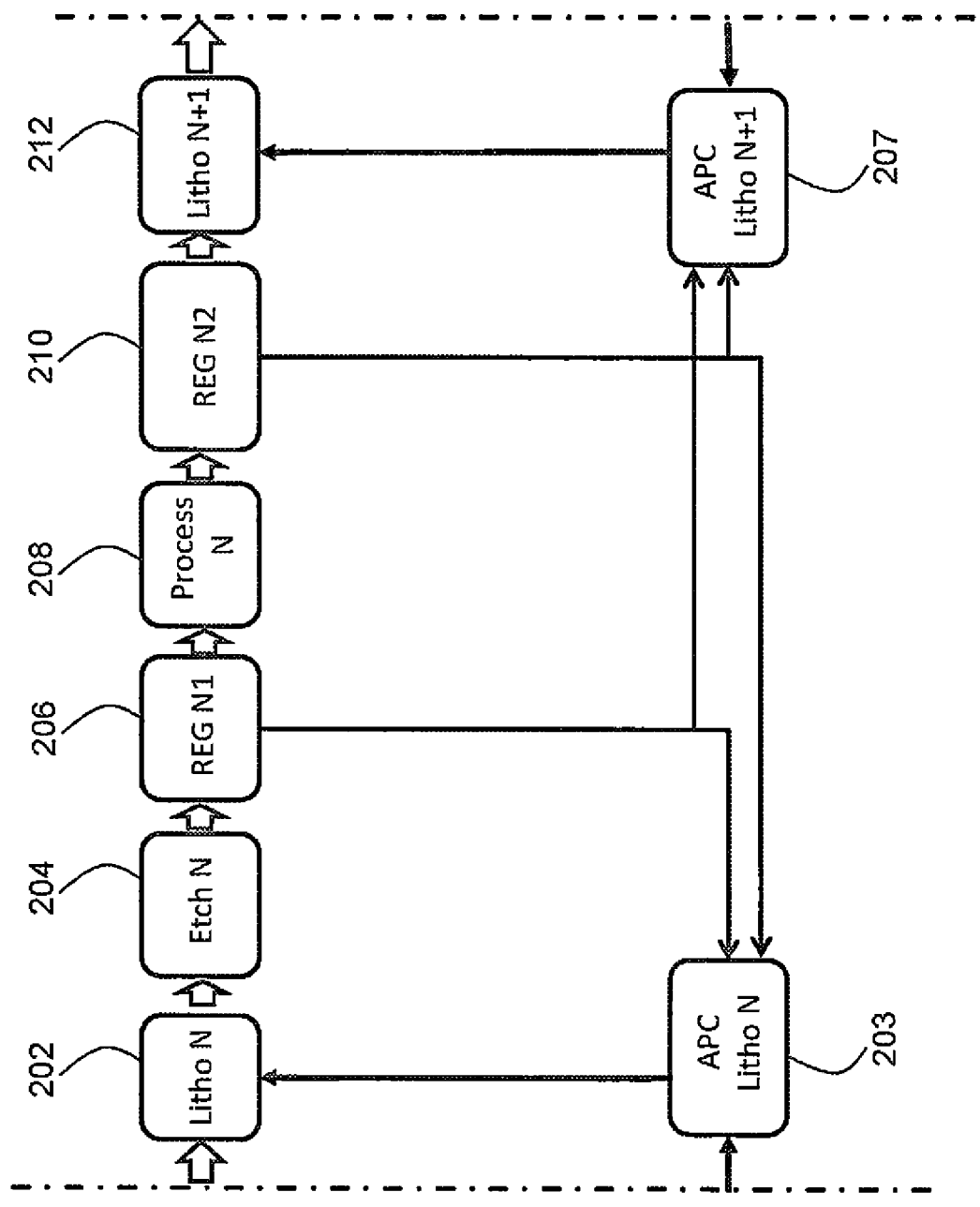
FIG. 2 is a diagram showing an embodiment of how the inventive method is used to control semiconductor manufacturing.

FIG. 2 is a diagram showing an embodiment of how the inventive method is used to control semiconductor manufacturing. In a step 202, a lithography process, the N-th in a series of lithography processes performed on a substrate, has created a pattern in a layer on the substrate, under control by automatic process control (APC) 203 for the N-th lithography step. In the embodiment shown, the lithography process is followed in step 204 by an etching process. After the etching, a registration measurement is carried out in step 206 with a registration tool. Possibilities for carrying out a registration measurement have been mentioned above. The results of this registration measurement, in particular the positions of patterns of interest in at least one layer on the substrate, are fed forward for automatic process control 207 of the next lithography step to be performed on the substrate, in step 212, but are also fed back to the automatic process control 203 for the N-th lithography step, in order to be taken into account when performing the N-th lithography step on a subsequent substrate. With prior art overlay measurements, only the feedback to the control for the N-th lithography step was possible, and such feedback therefore could only take effect for subsequent substrates. With the inventive method, also the feed-forward to the automatic process control 207 of a next step, here lithography step N+1, is possible, i.e. the results of the registration measurement can already be taken into account while further processing the substrate on which the registration measurement has been performed. The manufacturing process thus can react faster to errors or process excursions.

In the embodiment of FIG. 2, after the registration measurement of step 206 some further process is performed on the substrate in step 208. Non-limiting examples of such a further process as performed in step 208 are a polishing process or applying additional material on the substrate. After that process, another registration measurement is conducted on the substrate in step 210. The results of this registration measurement, like the results of the registration measurement performed in step 206, are fed back to the automatic process control 203 for the N-th lithography step, but are also fed-forward to the automatic process control 207 for the lithography step N+1. Both for the registration measurement in step 206 and for the registration measurement in step 210 it is conceivable to feed back to APC 203 for the N-th lithography step only a portion of the respective measurement results, and to feed forward to APC 207 for lithography step N+1 a different portion of the respective measurement results.

It should be noted that the automatic process controls 203 and 207, for lithography step N and N+1, respectively, can be carried out, for example, by one computer or by different computers.

Figure 3:
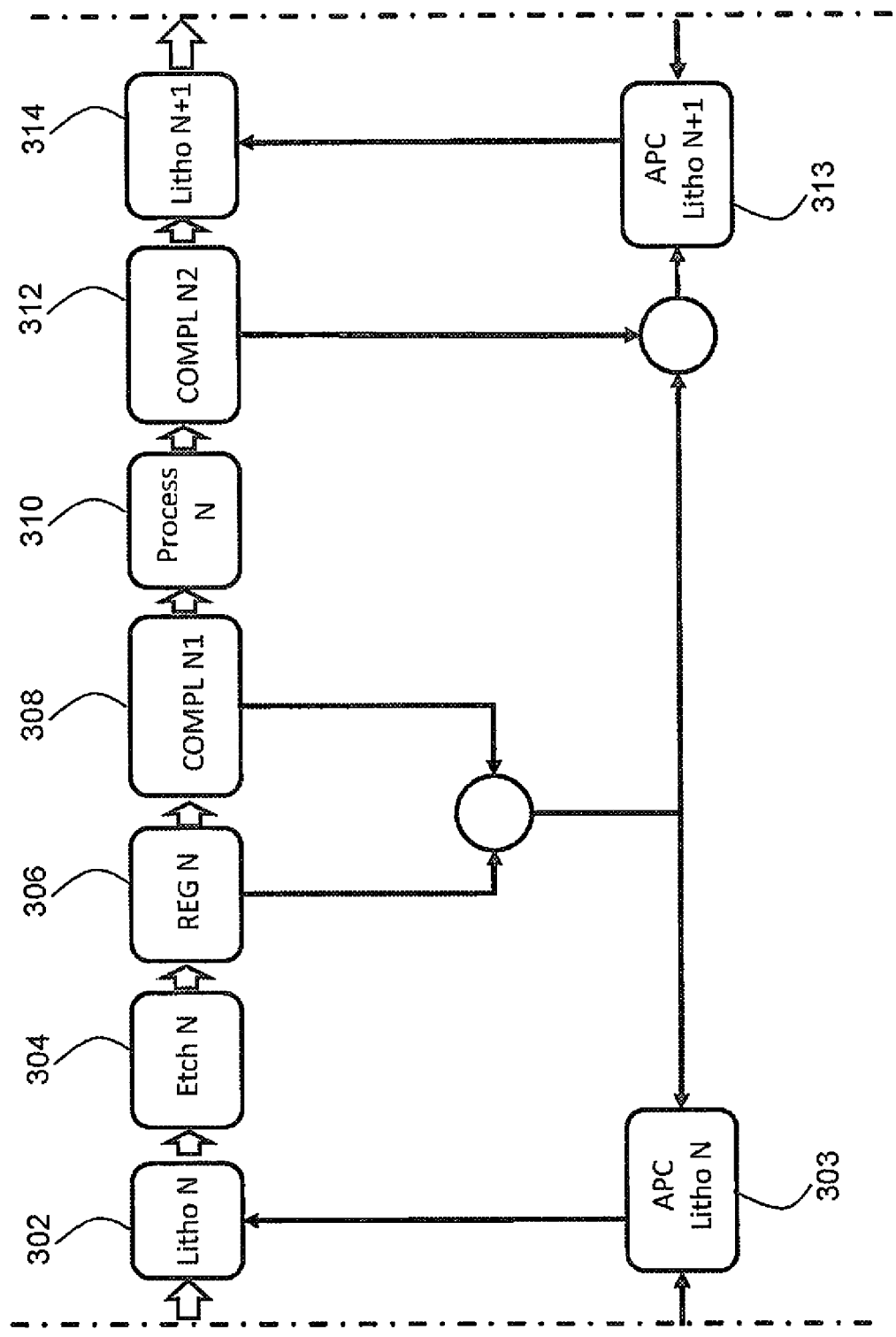
FIG. 3 is a diagram showing a further embodiment of how the inventive method is used to control semiconductor manufacturing.

FIG. 3 is a diagram showing a further embodiment of how the inventive method is used to control semiconductor manufacturing. Analogously to the embodiment discussed in FIG. 2, under control by an automatic process control APC 303 an N-th lithography step is performed on a substrate in step 302, followed by an etching step 304. Then a registration measurement is conducted on the substrate in step 306, results of which are fed back to the automatic process control 303 for the N-th lithography step and are fed forward to the automatic process control 313 for the next lithography step, to be performed in step 314. Afterwards, a first portion of complementary information is collected in step 308. The first portion of complementary information is provided both to automatic process control 303 for lithography step N and to automatic process control 313 for lithography step N+1. Then a further process step is performed on the substrate in step 310, which is followed by collecting a second portion of complementary information in step 312.

Non-limiting examples of such a further process step 310 are a polishing process or applying additional material on the substrate. The second portion of complementary information may be provided both to automatic process control 303 for lithography step N and to automatic process control 313 for lithography step N+1 As a non-limiting example, it may be the case that the further process step 310 introduces a distortion of the substrate. Such a distortion can then be determined as (part of) the second portion of complementary information, and provided to the automatic process control, in this case at least for lithography step N+1, as the distortion is not yet present when lithography step N is performed.

Figure 4:
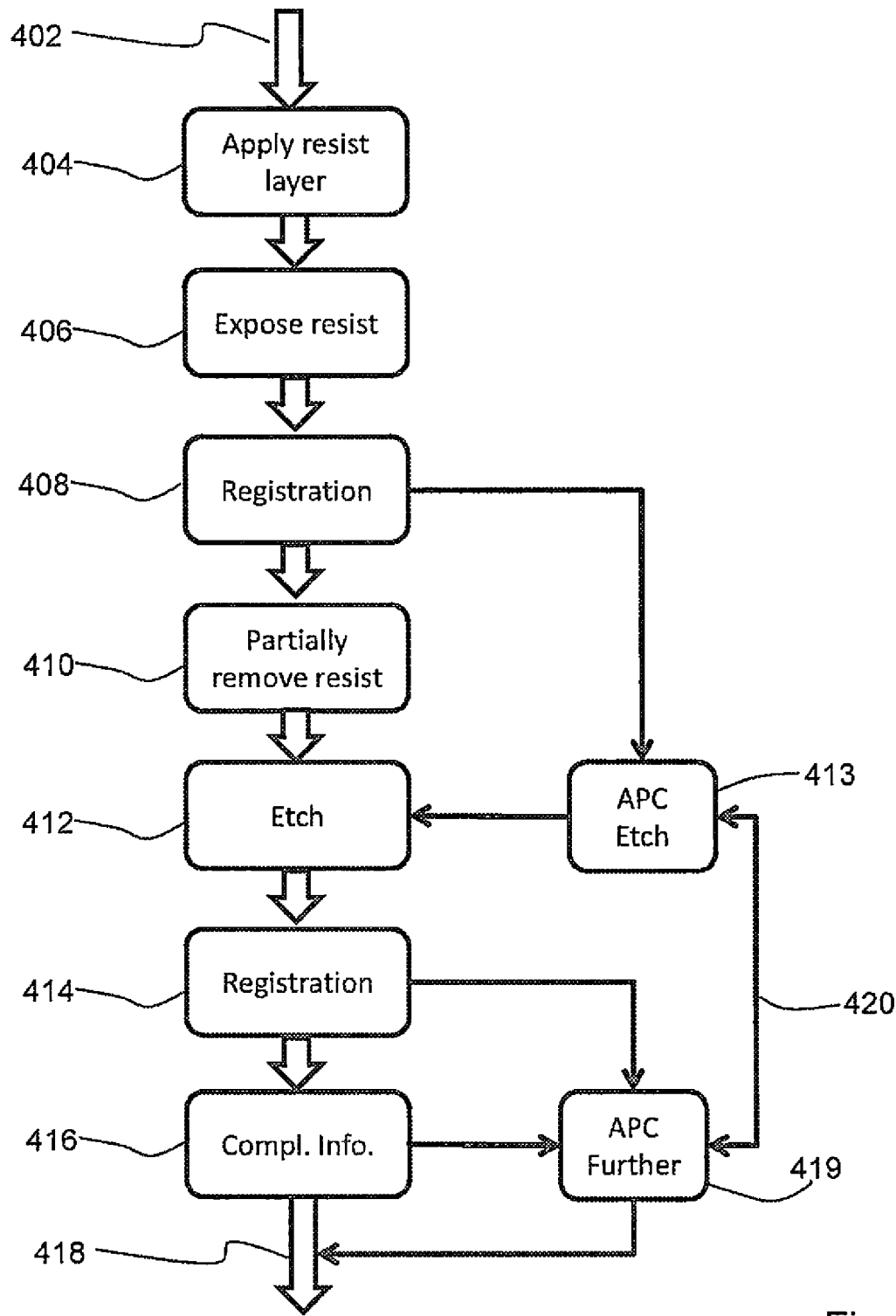
FIG. 4 shows a sequence of steps illustrating a further embodiment of the method according to the invention.

FIG. 4 shows a sequence of steps illustrating a further embodiment of the method according to the invention. For the sake of concreteness, the steps are chosen to be steps from a semiconductor manufacturing process, but the invention is not limited to semiconductor manufacturing.

The sequence of steps forms part of a manufacturing process; the stage at which this manufacturing process reaches the sequence of steps shown is indicated by arrow 402. In the specific embodiment shown, in step 404 a resist layer is applied on a substrate. This includes spreading liquid resist over a layer on the substrate and drying the resist. In step 406 the resist is exposed to light of a particular wavelength range.

In step 408, a registration measurement is performed on patterns created by the exposure to light in the resist layer. The results of the registration measurement are fed forward to the automatic process control 413 for controlling an etching of the substrate at a later stage. In step 410, the resist is partially removed, more precisely, depending on the type of resist, either the exposed or the unexposed portions of the resist are removed. In step 412, the substrate is submitted to an etching step, where parts of a layer on the substrate not covered by resist are affected by the etching. The etching step 412 is performed under control by automatic process control 413, which therein makes use of the results fed to it from the registration measurement in step 408. In this way, for example, if the registration measurement of step 408 determined some errors in the placement of patterns in the resist by the exposure step 406, the automatic process control 413 for the etching step may suitably control the etching step 412 to fully or partially compensate these placement errors.

In the general terminology of this application, in this embodiment the exposure of the resist in step 406 is the previous step, and the etching in step 412 is the subsequent step. As can be clearly seen, in this example, between the previous step and the subsequent step a further step, the partial removal of the resist, is performed in step 410. Also, a layer on the substrate may generally refer both to a layer of which at least a part remains in the completed device and to a layer which is present on the substrate only temporarily, like a resist layer.

In the example sequence of steps shown here, after the etching step 412, a further registration measurement is performed in step 414, and complementary information is collected in step 416. The nature of complementary information has already been discussed above; here for example, without being limited thereto, topography information on the substrate may be collected. The manufacturing process then continues to further stages, indicated by arrow 418. The results of the registration measurement of step 414, and the complementary information obtained in step 416, are fed to automatic process control 419 for steps to be carried out during these further stages.

As indicated by double arrow 420, results obtained by registration measurements in step 414 and complementary information obtained in step 416 may also be fed backwards to automated process control 413 for the etching step, to be taken into account when performing the sequence of steps shown in FIG. 4 on a subsequent substrate. In addition, results from registration measurement 408 may not only be provided to automatic process control 413 for the etching step, but also to automatic process control 419 for steps to be carried out during further stages of the manufacturing process.

Figure 5:
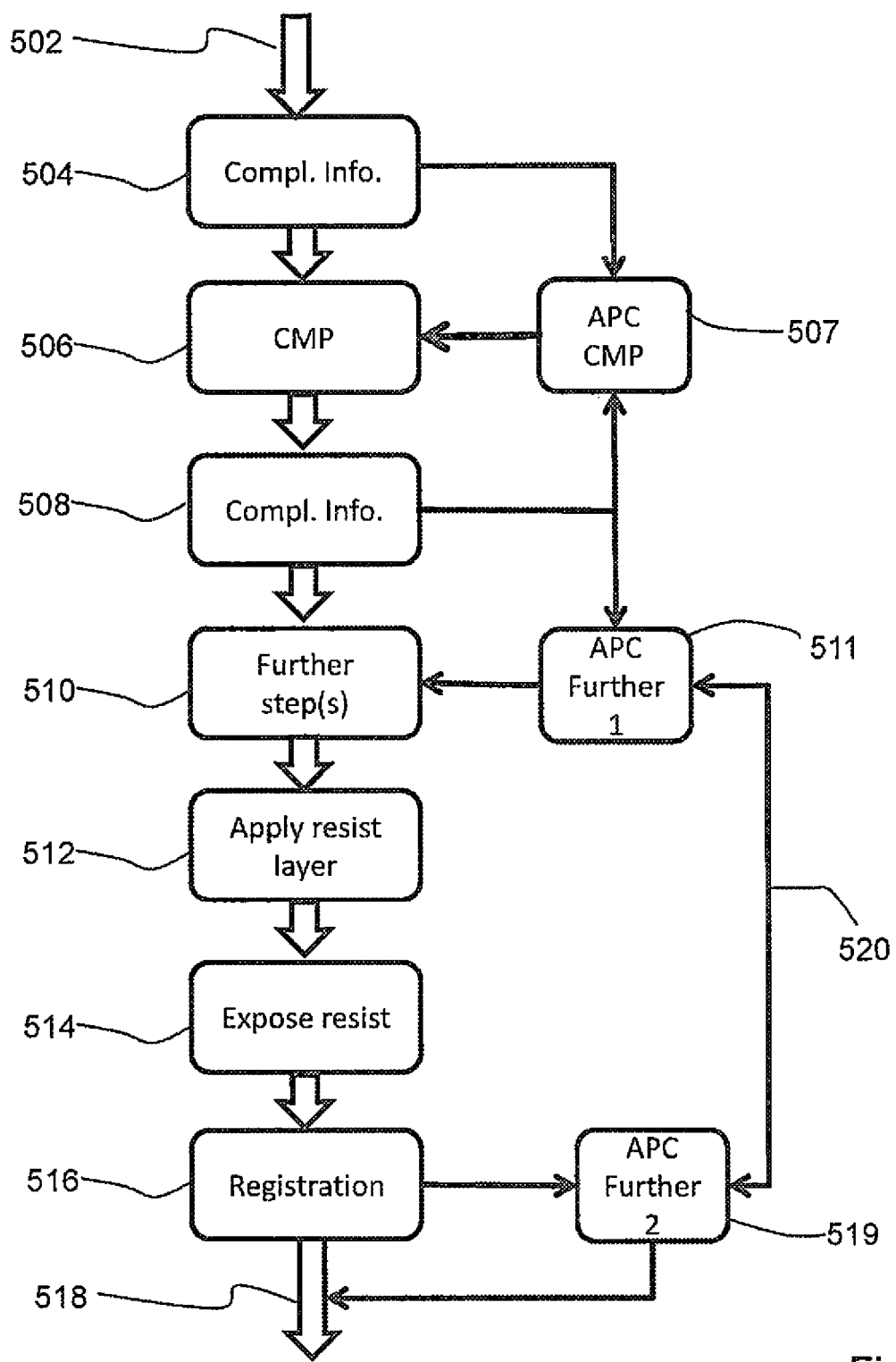
FIG. 5 shows a sequence of steps illustrating a further embodiment of the method according to the invention.

FIG. 5 shows a sequence of steps illustrating a further embodiment of the method according to the invention. For the sake of concreteness, the steps are chosen to be steps from a semiconductor manufacturing process on a wafer, but the invention is not limited to semiconductor manufacturing.

The sequence of steps forms part of a manufacturing process; the stage at which this manufacturing process reaches the sequence of steps shown is indicated by arrow 502. In step 504 complementary information on the wafer is obtained. The nature of complementary information has been mentioned above, in this specific example topography information on the wafer is obtained. The topography information is then fed into automatic process control 507 for controlling a chemical mechanical processing step 506. Chemical mechanical processing is a common procedure in semiconductor manufacturing. After the chemical mechanical processing, complementary information, in particular topography information, on the wafer is obtained again in step 508. This topography information is then fed back to the automatic process control 507 for the chemical mechanical processing. In this way, the chemical mechanical processing step 506 can be tightly monitored. Then, one or more further steps 510 may be carried out. These steps may be carried out under control by automatic process control 511; automatic process control 511 therein may use complementary information obtained in step 508. The further steps may for example include applying additional material on the substrate and/or a further polishing step. A resist layer may then be applied on the wafer in step 512. This includes spreading liquid resist over a layer on the substrate and drying the resist. In step 514 the resist is exposed to light of a particular wavelength range.

In step 516, a registration measurement is performed on patterns created by the exposure to light in the resist layer. The results of the registration measurement are fed forward to the automatic process control 519 for controlling steps to be carried out at a later stage of the manufacturing process, indicated by arrow 518.

As indicated by double arrow 520, complementary information obtained in step 508 may also be fed forward to the automatic process control 519 for controlling later stage processes. Results of registration measurements in step 516 may also be fed back to automatic process control 511 for controlling any of the further steps 510.

Note that in a specific example, the application of resist is step 512 may correspond to the resist application step 404 of the example in FIG. 4, while step 514 may correspond to step 406, and step 516 to step 408. The steps to be carried out at a further stage 518 of the manufacturing process may then include steps that correspond to the steps 410 and 412 of the example shown in FIG. 4.

Figure 6:
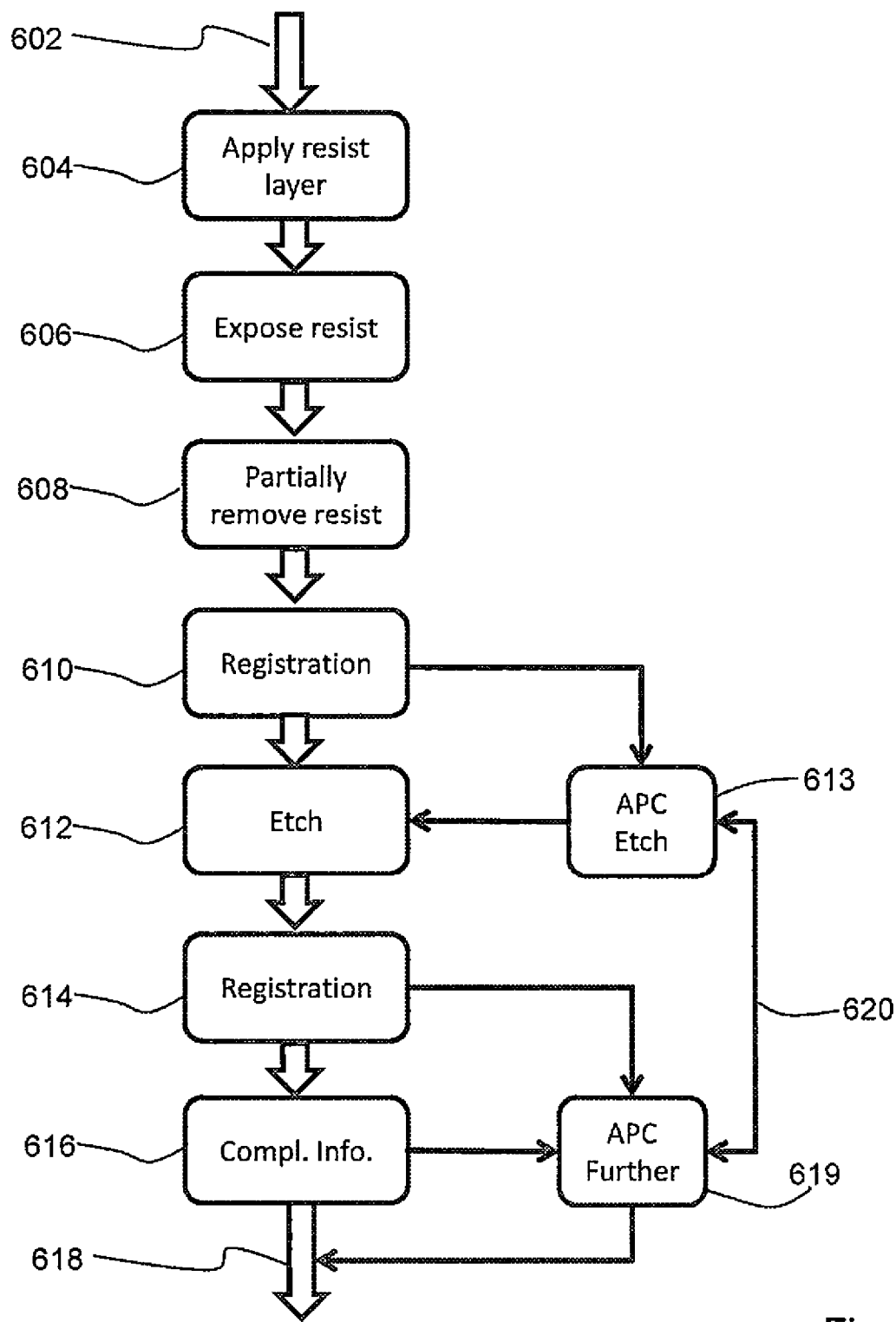
FIG. 6 shows a sequence of steps illustrating a further embodiment of the method according to the invention.

FIG. 6 shows a sequence of steps illustrating a further embodiment of the method according to the invention. For the sake of concreteness, the steps are chosen to be steps from a semiconductor manufacturing process, but the invention is not limited to semiconductor manufacturing.

The sequence of steps forms part of a manufacturing process; the stage at which this manufacturing process reaches the sequence of steps shown is indicated by arrow 602. In the specific embodiment shown, in step 604 a resist layer is applied on a substrate. This includes spreading liquid resist over a layer on the substrate and drying the resist. In step 606 the resist is exposed to light of a particular wavelength range.

In step 608, the resist is partially removed, more precisely, depending on the type of resist, either the exposed or the unexposed portions of the resist are removed. In step 610, a registration measurement is performed on patterns created in the resist layer by the exposure of the resist to light and partial removal of the resist layer. The results of the registration measurement are fed forward to the automatic process control 613 for controlling an etching of the substrate in step 612. In the etching step, parts of a layer on the substrate not covered by resist are affected by the etching. The etching step 612 is performed under control by automatic process control 613, which therein makes use of the results fed to it from the registration measurement in step 610. In this way, for example, if the registration measurement of step 610 determined some errors in the placement of patterns in the resist by the exposure step 606, or errors from the partial removal of the resist in step 608, the automatic process control 613 for the etching step may suitably control the etching step 612 to fully or partially compensate these errors.

In the example sequence of steps shown here, after the etching step 612, a further registration measurement is performed in step 614, and complementary information is collected in step 616. The nature of complementary information has already been discussed above; here for example, without being limited thereto, topography information on the substrate may be collected. The manufacturing process then continues to further stages, indicated by arrow 618. The results of the registration measurement of step 614, and the complementary information obtained in step 616, are fed to automatic process control 619 for steps to be carried out during these further stages.

As indicated by double arrow 620, results obtained by registration measurements in step 614 and complementary information obtained in step 616 may also be fed backwards to automated process control 613 for the etching step, to be taken into account when performing the sequence of steps shown in FIG. 6 on a subsequent substrate. In addition, results from registration measurement 610 may not only be provided to automatic process control 613 for the etching step, but also to automatic process control 619 for steps to be carried out during further stages of the manufacturing process.

Both the example sequence of steps of a manufacturing process shown in FIG. 4 and the example sequence of steps of a manufacturing process shown in FIG. 6 include steps of resist exposure, partial removal of the resist, and etching, steps 406, 410, and 412 in the example of FIG. 4, and steps 606, 608, and 612 in the example of FIG. 6. The examples differ with respect to the steps between which the first of the registration measurements shown in the respective example, step 408 in FIG. 4 and step 610 in FIG. 6, is carried out. It may for example be rather difficult to perform a registration measurement on patterns in exposed, non-developed resist; in such a case, the sequence of steps shown in FIG. 6 may be more adequate. The embodiments of FIG. 4 and FIG. 6 are also intended to underline, by way of example, that in the method according to the invention registration measurements may be carried out after any step of the manufacturing process, and that the method according to the invention includes the freedom to perform the registration measurements at stages of, or between steps of, the manufacturing process at which it is most adequate or feasible to do so.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

REFERENCE SIGNS 1, 2, 3, 4, 5 structure
11, 21, 31, 41, 51 pattern of first layer
12,22,32,42 pattern of second layer
6 relative position shift
61 first average position
62 second average position
7 substrate
8 coordinate system for manufacturing process

What is claimed is:

1. A method for controlling the positioning of patterns on a substrate in a manufacturing process, the method comprising the steps of:
conducting at least one registration measurement with a registration tool on at least one pattern formed in at least one layer on the substrate by a previous process step of the manufacturing process;
collecting complementary information, the complementary information including topography information on the substrate or overlay information;
determining from the registration measurement a position of the at least one pattern in a coordinate system for the manufacturing process; and
feeding the determined position of the at least one pattern and the complementary information into an automatic process control of a manufacturing system for controlling a setup of the manufacturing system for a subsequent process step of the manufacturing process.

2. The method of claim 1, wherein the coordinate system for the manufacturing process is identical to a coordinate system for the registration tool.

3. The method of claim 1, wherein the determined position of the at least one pattern is also fed to the automatic process control for controlling a setup of the manufacturing system for performing the previous process step of the manufacturing process on a subsequent substrate.

4. The method of claim 1, wherein the complementary information is collected at least after the previous process step.

5. The method of claim 1, wherein the substrate is a silicon wafer.

6. The method of claim 1, wherein at least the previous process step or at least the subsequent process step includes performing lithography on the substrate.

7. The method of claim 6, wherein the manufacturing system includes a lithography scanner.

8. The method of claim 1, wherein at least the previous process step or at least the subsequent process step includes at least one of performing an etching on the substrate, depositing a layer on the substrate, or Chemical Mechanical Polishing.

9. The method of claim 1, wherein the at least one pattern includes a target for overlay measurements.

10. The method of claim 1, wherein the at least one pattern includes a functional pattern.

11. A method for controlling the positioning of patterns on a silicon substrate in a manufacturing process for a wafer, the method comprising the steps of:

conducting at least one registration measurement with a registration tool on at least one pattern formed in at least one layer on the substrate by lithography in a previous lithography process step of the manufacturing process;

collecting complementary information, the complementary information including topography information on the substrate or overlay information;

determining from the registration measurement a position of the at least one pattern in a coordinate system for the manufacturing process; and feeding the determined position of the at least one pattern and the complementary information into an automatic process control of a manufacturing system for controlling a setup of the manufacturing system for a subsequent lithography process step of the manufacturing process.

12. The method of claim 11, wherein the coordinate system for the manufacturing process is identical to a coordinate system for the registration tool.

13. The method of claim 11, wherein the determined position of the at least one pattern is also fed to the automatic process control for controlling a setup of the manufacturing system for performing the previous lithography process step of the manufacturing process on a subsequent substrate.

14. The method of claim 11, wherein at least one further process step is carried out between the previous lithography process step and the subsequent lithography process step, and at least one of the at least one registration measurement is carried out after at least one of the at least one further process step.

15. The method of claim 14, wherein additional complementary information is collected after at least one of the at least one further process step and fed into the automatic process control.

16. The method of claim 14, wherein the at least one further process step includes at least one of an etching step, a deposition of a layer, an annealing, resist developing, or Chemical Mechanical Polishing.

17. The method of claim 11, wherein at least one further process step is carried out between the previous lithography process step and the subsequent lithography process step, and at least one of the at least one registration measurement is carried out before the at least one further process step, a position of at least one pattern in a coordinate system for the manufacturing process is determined from the at least one of the at least one registration measurement, and the position is fed into the automatic process control of the manufacturing system for controlling the setup of the manufacturing system for carrying out the at least one further process step.

18. The method of claim 17, wherein additional complementary information is collected at least after at least one of the at least one further process step and fed into the automatic process control.

19. A method for controlling the positioning of patterns on a silicon substrate in a manufacturing process for a wafer, the method comprising the steps of:

forming at least one pattern in at least one layer on the substrate by lithography in a previous lithography process step of the manufacturing process;

performing an etch process on the at least one layer on the substrate;

conducting at least one registration measurement with a registration tool on at least one pattern formed in the at least one layer on the substrate;

determining from the registration measurement a position of the at least one pattern in a coordinate system for the manufacturing process;

collecting a first portion of complementary information, the first portion of complementary information including topography information on the substrate or overlay information;

conducting at least one further process step;

collecting a second portion of complementary information, the second portion of complementary information including topography information on the substrate or overlay information;

feeding the determined position of the at least one pattern, the first portion of complementary information, and the second portion of complementary information into an automatic process control of a manufacturing system for controlling a setup of the manufacturing system for a subsequent lithography process step of the manufacturing process; and carrying out the subsequent lithography process step.

20. The method of claim 19, wherein the at least one further step is an application of additional material on the substrate, a deposition of a further layer on the substrate, or a polishing step.

21. A computer program product stored on a non-transitory computer readable medium, the computer program product comprising computer readable instructions for at least one computer to control a manufacturing system to carry out the method of claim 1.

22. A computer program product stored on a non-transitory computer readable medium, the computer program product comprising computer readable instructions for at least one computer to control a manufacturing system to carry out the method of claim 11.

23. A computer program product stored on a non-transitory computer readable medium, the computer program product comprising computer readable instructions for at least one computer to control a manufacturing system to carry out the method of claim 19.

* * * * *